(12) United States Patent
Kim et al.

(10) Patent No.: US 7,545,680 B2
(45) Date of Patent: Jun. 9, 2009

(54) FLASH MEMORY DEVICE AND WORD LINE ENABLE METHOD THEREOF

(75) Inventors: Jin-Kook Kim, Seoul (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/599,434

(22) Filed: Nov. 15, 2006

(65) Prior Publication Data

US 2007/0109862 A1      May 17, 2007

(30) Foreign Application Priority Data

Nov. 17, 2005   (KR)   ...................... 10-2005-0109999

(51) Int. Cl.
*G11C 16/04*       (2006.01)
(52) U.S. Cl. .................... 365/185.23; 365/185.17; 365/185.18; 365/185.19
(58) Field of Classification Search ............ 365/185.23, 365/185.17, 185.18, 185.19
See application file for complete search history.

(56) References Cited

U.S. PATENT DOCUMENTS

| 5,812,457 | A | 9/1998 | Arase |
| 6,469,923 | B1 | 10/2002 | Hidaka |
| 6,469,933 | B2 * | 10/2002 | Choi et al. ............ 365/185.17 |
| 6,804,150 | B2 | 10/2004 | Park et al. |
| 7,269,068 | B2 * | 9/2007 | Chae et al. ............ 365/185.18 |
| 2003/0048662 | A1 | 3/2003 | Park et al. |
| 2004/0080980 | A1 * | 4/2004 | Lee ........................ 365/185.17 |

FOREIGN PATENT DOCUMENTS

| JP | 2003-123491 | 4/2003 |
| KR | 1020000027560 A | 5/2000 |
| KR | 1020020039744 A | 5/2002 |
| KR | 10200230021647 A | 3/2003 |

* cited by examiner

*Primary Examiner*—Connie C Yoha
(74) *Attorney, Agent, or Firm*—Volentine & Whitt, PLLC

(57) ABSTRACT

In one aspect, a word line enable method in a flash memory device includes driving a signal line corresponding to a selected word line with a word line voltage, and stepwise increasing a gate voltage of a switch transistor connected between the selected word line and the signal line during a program execute period.

24 Claims, 5 Drawing Sheets

FLASH MEMORY DEVICE AND WORD LINE ENABLE METHOD THEREOF

BACKGROUND OF THE INVENTION

1. Field of the Invention

The present invention generally relates to semiconductor memory devices and, more particularly, the present invention relates to method of programming a flash memory device and to a method of enabling a word line of a flash memory device.

A claim of priority under 35 U.S.C § 119 is made to Korean Patent Application 2005-109999 filed on Nov. 17, 2005, the entire contents of which are hereby incorporated by reference.

2. Description of the Related Art

A flash memory device, known as a flash EEPROM (electrically erasable programmable read-only memory), typically includes an array of memory cells formed of floating gate transistors. In a NAND-type flash memory device, the array includes strings (or, "NAND strings") of series connected the floating gate transistors, with each NAND string being connected in series between a string selection transistor and a ground selection transistor. A plurality of word lines intersect the NAND strings and are connected to the control gates of corresponding floating gate transistors.

In an initial erased state, the floating gate transistors, i.e., memory cells, have a lower threshold voltage (e.g. −3V). To program a given memory cell, a high voltage (e.g., 20V) is applied to the word line of a selected memory cell for a predetermined period of time to cause the selected memory cell to have higher threshold voltage. Meanwhile, the threshold voltages of unselected memory cells do not change.

A potential problem arises when programming the selected memory cell. That is, when a program voltage is applied to the word line of the selected memory cell, the same voltage is also applied to the unselected memory cells connected along the same word line. Thus, the unselected memory cells connected to the word line, and in particular, the memory cell or cells adjacent to the selected memory cell may unintentionally be programmed. Such unintentional programming of one or more unselected memory cells is referred to as "program disturb".

A conventional method utilized in an attempt to prevent the problem of program disturb is known as a program inhibition method employing a self-boosting scheme. The program inhibition method employing the self-boosting scheme is disclosed in U.S. Pat. No. 5,677,873 entitled "Method of Programming Flash EEPROM Integrated Circuit Memory Devices To Prevent Inadvertent Programming of Nondesignated NAND Memory Cells Therein", and U.S. Pat. No. 5,991,202 entitled "Method for Reducing Program Disturb During Self-Boosting in a NAND Flash Memory", which are incorporated herein by reference.

In the program inhibition method using the self-boosting scheme, a ground path is blocked by applying 0V to the gate of a ground selection transistor. 0V is applied to a selected bit line, while a power supply voltage Vcc of 3.3V or 5V is applied as a program inhibition voltage to an unselected bit line. At the same time, after the source of a string selection transistor is charged to Vcc-Vth (Vth: a threshold voltage of the string selection transistor) by applying the power supply voltage to the gate of the string selection transistor, the string selection transistor is virtually blocked. A channel voltage of the program inhibited cell transistor is then boosted by applying the program voltage Vpgm to the selected word line, and pass voltage Vpass to the unselected word lines. Thus, Fowler-Nordheim (F-N) tunneling cannot take place between the floating gate and the channel, thereby keeping the program inhibited cell transistor in the initial erased state.

In the conventional program inhibition methods utilizing the self-boosting scheme, a problem arises as the density of the flash memory device is increased. That is, as the integration density is increased, the intervals between adjacent signal lines are reduced, thereby increasing the possibility of coupling between the adjacent signal lines.

As a result, for example, when a memory cell adjacent to the string selection transistor is programmed, the voltage on the string selection line (e.g., the power supply voltage) may be boosted as a result of capacitive coupling with the word line when the program voltage is applied to the selected word line. The rising voltage of the string selection line can cause the string selection transistor to turn on, which in turn can cause charges in the channel of the program inhibited cell transistor to go out to the unselected bit line through the string selection transistor. This can result in a soft programming of the program inhibited cell transistor due to a reduction of the channel voltage of the program inhibited cell transistor.

Also, when the pass voltage is applied as a high voltage to a word line adjacent to the string selection line, the voltage on the string selection line (e.g., the power supply voltage) may be boosted due to capacitive coupling with the word line. The resultant rising voltage of the string selection line can turn on the string selection transistor, which can cause charges in the channel of the program inhibited cell transistor to go out to the unselected bit line through the string selection transistor. Again, this can result in a soft programming of the program inhibited cell transistor due to a reduction of the channel voltage of the program inhibited cell transistor.

Further, when the program voltage is applied to the selected word line, the pass voltage of an unselected word line is boosted due to the program voltage of the selected word line. This too can result in soft programming of memory cells of the unselected word line.

SUMMARY OF THE INVENTION

According to one aspect of the present invention, a word line enable method in a flash memory device is provided which includes driving a signal line corresponding to a selected word line with a word line voltage, and stepwise increasing a gate voltage of a switch transistor connected between the selected word line and the signal line during a program execute period.

According to another aspect of the present invention, a word line enable method in a flash memory device is provided which includes generating a high voltage which is higher than a word line voltage, driving a signal line corresponding to a selected word line with the word line voltage, generating a stepwise increased block word line voltage in response to the high voltage during a program execute period, and driving the selected word line with the word line voltage of the signal line in response to stepwise increased block word line voltage.

According to still another aspect of the present invention, a flash memory device is provided which includes a memory block including memory cells connected to word lines and bit lines, a first decoding and driving block for driving signal lines corresponding to the respective word lines with word line voltages, a block word line voltage generator circuit for receiving a high voltage and generating a block word line voltage that increases stepwise during a program execute period, a second decoding and driving block for driving a block word line with the block word line voltage, and a pass gate circuit for connecting the signal lines to the respective word lines in response to the block word line voltage.

BRIEF DESCRIPTION OF THE DRAWINGS

The above and other aspect and features of the present invention will become readily apparent from the detailed description that follows, with reference to the accompanying drawings, in which.

DETAILED DESCRIPTION OF PREFERRED EMBODIMENTS

Figure 1:
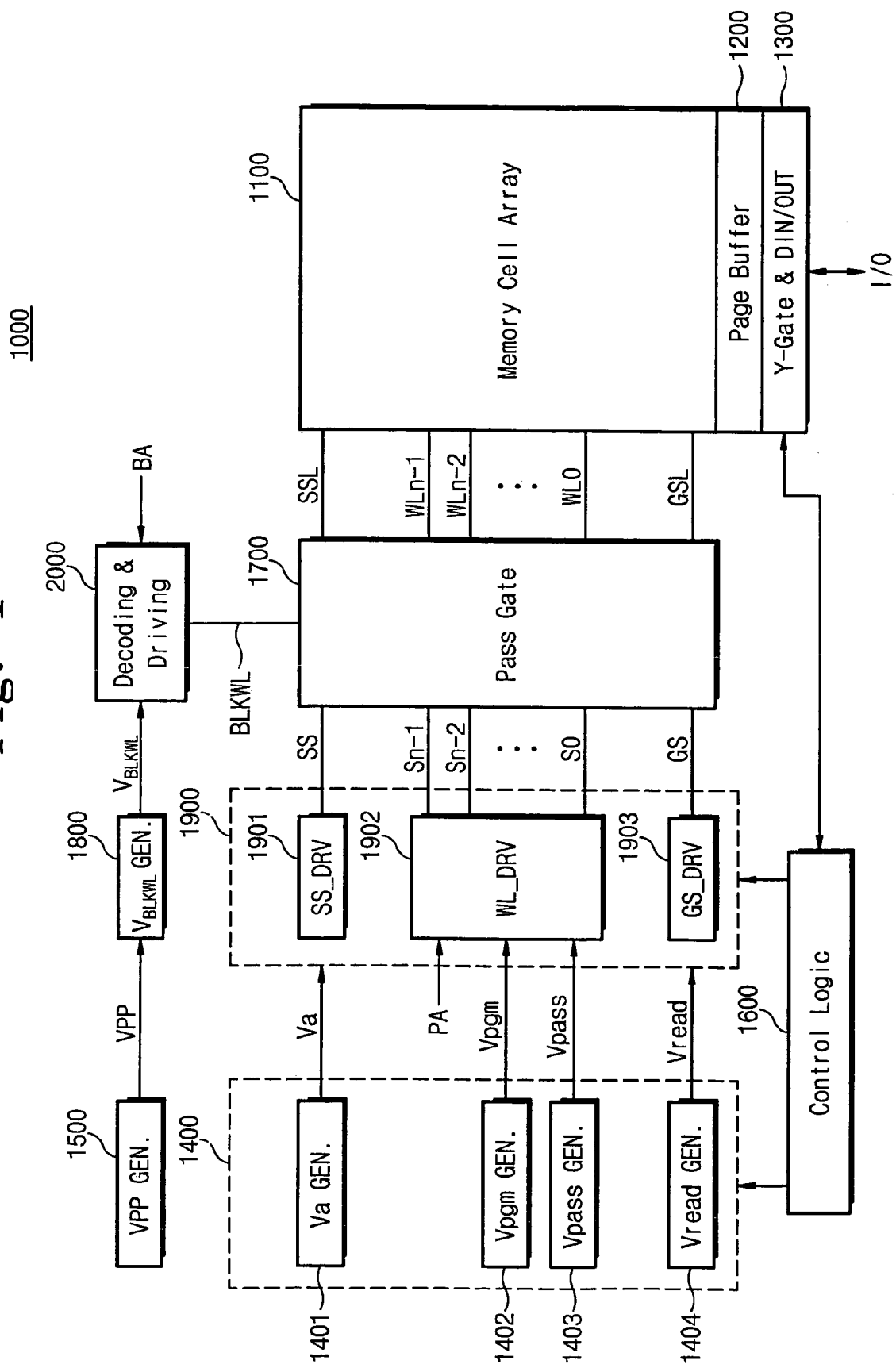
FIG. 1 is a block diagram showing a flash memory device according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram showing a flash memory device according to an exemplary, but non-limiting, embodiment the present invention.

Referring to FIG. 1, a flash memory device 1000 includes a memory cell array 1100 for storing data, i.e, 1-bit data or N-bit data (N is an integer of 2 or more), a page buffer 1200, a column gate and data input/output circuit 1300, a word line voltage generator block 1400, a high-voltage generator block 1500, a control logic 1600, a pass gate circuit 1700, a block word line voltage generator circuit 1800, a first decoding and driving block 1900 and a second decoding and driving block 2000.

Generally, the memory cell array 1100 includes plural memory blocks, but for simplicity, the memory cell array 1100 illustrated in FIG. 1 corresponds to one memory block.

Figure 2:
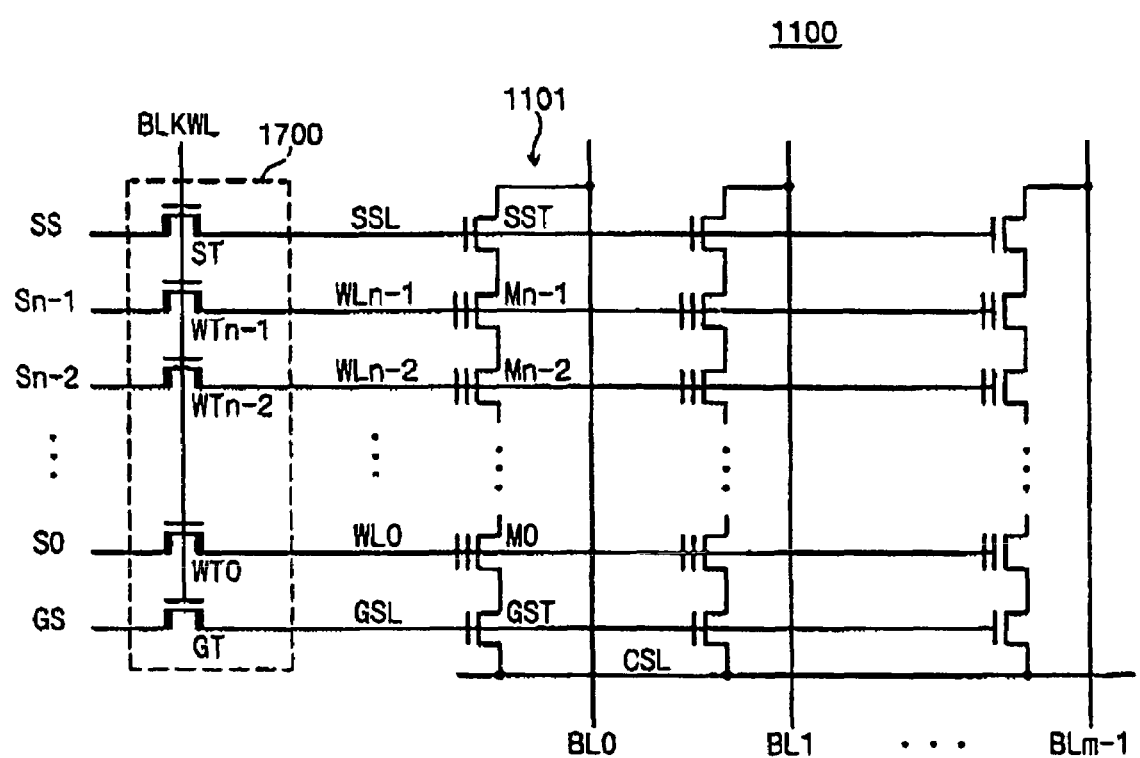
FIG. 2 is a circuit diagram showing a memory cell array and a pass gate circuit illustrated in FIG. 1 according to an embodiment of the present invention.

Referring to the example of FIG. 2, the memory cell array 1100 is configured of a plurality of NAND strings 1101. Each NAND string 1101 includes a string selection transistor SST, a ground selection transistor GST, and a plurality of memory cells (floating gate transistors) Mn-1 to M0 connected in series between a source of the string selection transistor SST and a drain of the ground selection transistor GST. In each NAND string 1101, a drain of the string selection transistor SST is electrically connected to a corresponding bit line BL0 to BLm-1, and a source of the ground selection transistor GST is connected to a common source line (or a common signal line) CSL. (The bit lines BL0 to BLm-1 are electrically connected to the page buffer circuit 1200 illustrated in FIG. 1.) Also, in each NAND string 1101, gates of the string selection transistors SST are commonly connected to a string selection line SSL, and gates of the ground selection transistors GST are commonly connected to a ground selection line GSL. Further, control gates of the floating gate transistors Mn-1 to M0 in each NAND string 1101 are connected to corresponding word lines WLn-1 to WL0, respectively.

Still referring to FIG. 2, the word lines WLn-1 to WL0, the string select line SSL, and the ground select line GSL are connect to the pass gate circuit 1700. In particular, the pass gate circuit 1700 is configured to the connect string and ground selection lines SSL and GSL and word lines WLn-1 to WL0 to corresponding signal lines SS, GS, and Sn-1 to S0 in response to the activation of a block word line BLKWL. The pass gate circuit 1700, in the example of FIG. 2, includes of a plurality of switch transistors ST, WTn-1 to WT0, and GT. Gates of the switch transistors ST, WTn-1 to WT0, and GT are commonly connected to the block word line BLKWL. When the block word line BLKWL is activated, the string and ground selection lines SSL and GSL and the word lines WLn-1 to WL0 are connected to the signal lines SS, GS, and Sn-1 to S0 via the corresponding switch transistors ST, GT, and WTn-1 to WT0. The switch transistors ST, GT, and WTn-1 to WT0 may be implemented as high voltage transistors capable enduring the high voltage VPP.

Returning to FIG. 1, the page buffer circuit 1200 operates as a sense amplifier and as a write driver according to an operating mode. For example, the page buffer circuit 1200 operates as a sense amplifier during a read operation and as a write driver during a program operation. In the read operation, the page buffer circuit 1200 senses data bits from memory cells of a selected word line and externally outputs the sensed data bits in a predetermined data unit (e.g., x8, x16, x32, etc.) through the column gate and data input/output circuit 1300. In the program operation, the page buffer circuit 1200 stores program data transferred via the column gate and data input/output circuit 1300 and drives the bit lines BL0 to BLm-1 with bit line bias voltages (e.g., a power supply voltage and a ground voltage) based on the stored program data. Although not illustrated in figures, in a case where one word line constitutes one page, the page buffer circuit 1200 may include page buffers each corresponding to bit lines. In a case where one word line constitutes a plurality of pages, the page buffer circuit 1200 may include page buffers each corresponding to bit lines of one page.

Still referring to FIG. 1, the word line voltage generator block 1400 includes a plurality of voltage generators and is controlled by the control logic 1600 and generates word line voltages which are supplied to the word lines WLn-1 to WL0 according to an operating mode. For example, the word line voltage generator block 1400 includes a string selection line voltage generator 1401 ("Va GEN."), a program voltage generator 1402 ("Vpgm GEN."), a pass voltage generator 1403 ("Vpass GEN."), and a read voltage generator 1404 ("Vread GEN."). The string selection line voltage generator 1401 is controlled by the control logic 1600, and generates a string selection line voltage Va to be supplied to the string selection line SSL. The program voltage generator 1402 is controlled by the control logic 1600, and generates a program voltage Vpgm to be supplied to a selected word line during a program operation. The pass voltage generator 1403 is controlled by the control logic 1600, and generates a pass voltage Vpass to be supplied to unselected word lines during the program operation. The read voltage generator 1404 is controlled by the control logic 1600, and generates a read voltage Vread as a verify voltage to be supplied to a selected word line during a program verify operation and as a voltage to be supplied to unselected word lines during a read operation. In the case where the flash memory device adopts an incremental step pulse programming (ISPP) scheme, the program voltage Vpgm may be increased in predetermined increments according to an iteration of program loops. On the other hand, as program loops are repeated, the remaining voltages Va, Vread and Vpass may be maintained without variation.

The high voltage generator circuit 1500 ("VPP GEN.") is controlled by the control logic 1600, and generates a high voltage VPP (e.g., 23V) that is higher than the program voltage Vpgm (e.g., 15V to 20V).

As well known in the art, a program loop includes a bit line setup/dump period, a program period (or program execute period), a discharge period, a verify period, and a column scan period. The program period is divided into a pass voltage enable period Vpass_EN and a program voltage enable period Vpgm_EN. During the bit line setup/dump period, bit lines are pre-charged with a power supply voltage, and then are selectively grounded according to program data in the page buffer circuit 1200. During the program execute period, word lines are driven with a pass voltage Vpass during a predetermined time (or, during the pass voltage enable period), and a selected one of the word lines is driven with a program voltage Vpgm during a given time (or, during the program voltage enable period). After discharging voltages of the word lines, during the verify period, the page buffer circuit 1200 senses data bits from memory cells of the selected word line. The sensed data bits may be transferred to the control logic 1600 via the column gate circuit 1300 in order to judge a program pass/fail. The control logic 1600 judges the program pass/fail based on input data bits, and controls a program loop according to the judgment result. Although not illustrated in figures, the control logic 1600 may include a circuit (referred to as a program pass/fail check circuit) for judging the program pass/fail.

The block word line voltage generator circuit 1800 ("$V_{BLKWL}$ GEN.") is controlled by the control logic 1600, and generates a block word line voltage $V_{BLKWL}$ according to the high voltage VPP from the high voltage generator circuit 1500 and voltages (e.g., Vread and Vpass) from the word line voltage generator circuit 1400 during a program operation. The block word line voltage generator circuit 1800 generates the block word line voltage $V_{BLKWL}$ so that the pass voltage Vpass is stepwise transferred to word lines in the pass voltage enable period Vpass_EN. Likewise, the block word line voltage generator circuit 1800 generates the block word line voltage $V_{BLKWL}$ so that the program voltage Vpgm is stepwise transferred to a selected word line in the program voltage enable period Vpgm_EN. This will be more fully described below. A voltage of the block word line BLKWL is stepwise increased in each of the pass and program voltage enable periods Vpass_EN and Vpgm_En. In other words, the pass/program voltage is supplied to a word line with a gradually increasing transition slope, rather than a sharp or vertical transition slope. As explained later, this decreases a capacitive coupling between adjacent word lines and between a string selection line SSL and a word line (e.g., WLn-1).

The first decoding and driving block 1900 is controlled by the control logic 1600, and includes a first driver 1901 ("SS_DRV"), a second driver 1902 ("WL_DRV"), and a third driver 1903 ("GS_DRV"). The first driver 1901 is supplied with the string selection line voltage Va and drives the signal line SS with the input voltage Va during a program operation. The third driver 1903 drives the signal line GS with a ground voltage during the program operation. The first and third drivers 1901 and 1903 may also drive the signal lines SS and GS with a read voltage Vread during a verify read operation. The second driver 1902 decodes a page address PA and selects one of the signal lines S0 to Sn-1 based on the decoded result. The second driver 1902 drives a selected signal line (e.g., S0) with the program voltage Vpgm and unselected signal lines (e.g, S1 to Sn-1) with the pass voltage Vpass. In particular, the second driver 1902 drives all signal lines with the pass voltage Vpass during the pass voltage enable period Vpass_EN and drives a selected signal line with the program voltage Vpgm during the program voltage enable period Vpgm_EN.

The second decoding and driving block 2000 decodes a block address BA and drives the block word line BLKWL with the block word line voltage $V_{BLKWL}$. As described above, the block word line voltage is stepwise increased preferably to emulate a constant slope within a program period. This enables the word lines WL0 to WLn-1 to be driven stepwise with the pass/program voltage Vpass/Vpgm via the pass gate circuit 1700.

As suggested above, in order to reduce or suppress a capacitive coupling between signal lines (e.g., between a string selection line and a word line or between word lines), the slope of the pass/program voltage is adjusted by controlling the block word line voltage VBLKWL, rather than by controlling of the program and pass voltages Vpgm and Vpass.

Figure 3:
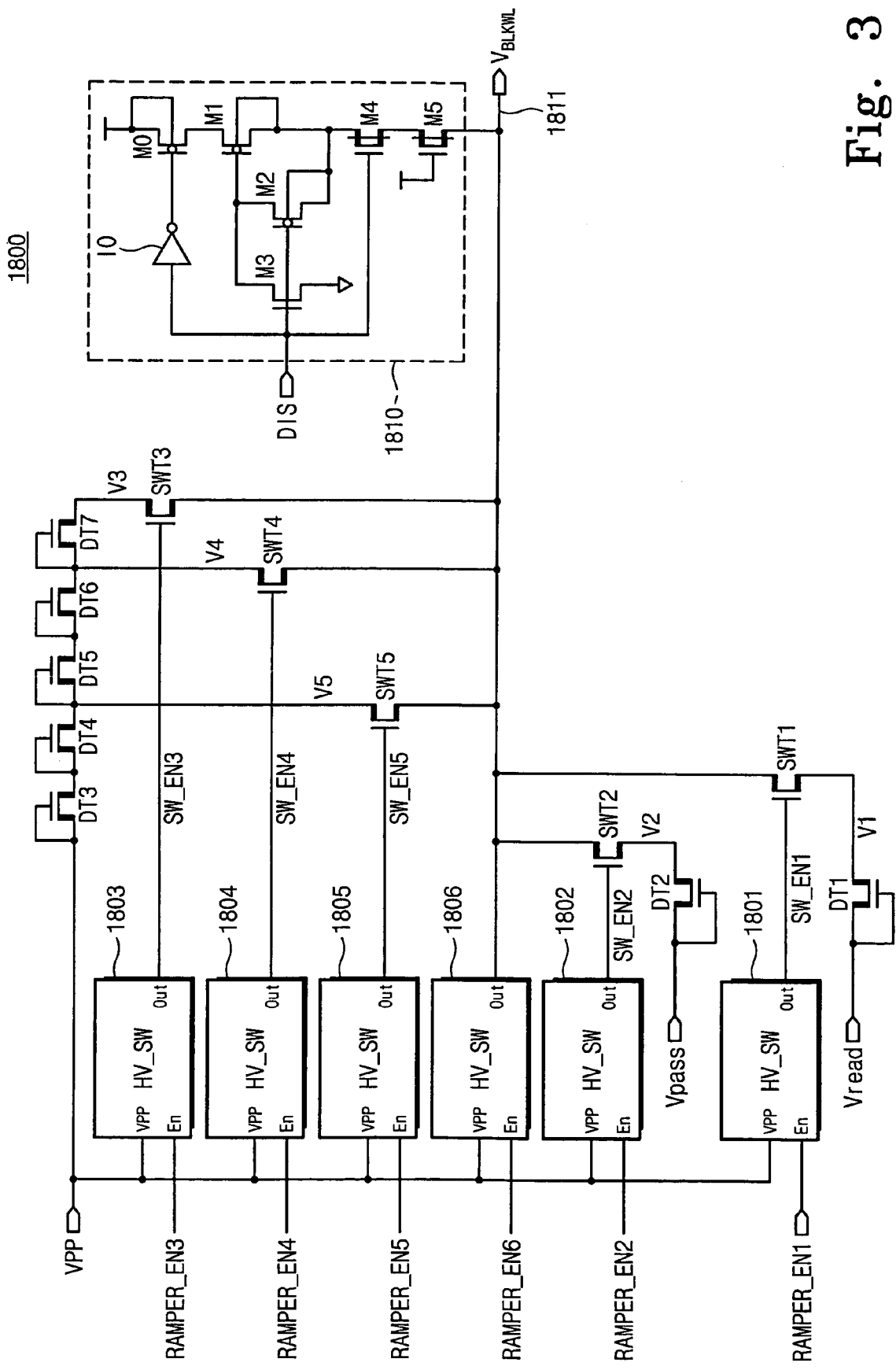
FIG. 3 is a circuit diagram showing a block word line voltage generator circuit illustrated in FIG. 1 according to an embodiment of the present invention.

FIG. 3 is a circuit diagram showing a block word line voltage generator circuit 1800 illustrated in FIG. 1 according to an embodiment of the present invention.

Referring to FIG. 3, a block word line voltage generator circuit 1800 is supplied with a high voltage VPP, a pass voltage Vpass, and a read voltage Vread, and generates a block word line voltage $V_{BLKWL}$ in response to control signals DIS and RAMPER_EN1 to RAMPER_EN6, which are supplied from control logic 1600 illustrated in FIG. 1.

The block word line voltage generator circuit 1800 of this example includes a plurality of high-voltage switches ("HV_SW") 1801 to 1806 to which respective control signals RAMPER_EN1 to RAMPER_EN6 are applied to enable (En) terminals thereof. The high-voltage switches 1801 to 1806 receive the high voltage VPP from the high voltage generator circuit 1500 illustrated in FIG. 1. Each high-voltage switch 1801 to 1806 outputs a switch enable signal SW_EN1 to SW_EN6 having the high voltage VPP when a corresponding control signal RAMPER_EN1 to RAMPER_EN6 is activated. That is, the high-voltage switch 1801 outputs the switch enable signal SW_EN1 when the control signal RAMPER_EN1 is activated, the high-voltage switch 1802 outputs the switch enable signal SW_EN2 when the control signal RAMPER_EN2 is activated, and so on.

As illustrated in FIG. 3, the block word line voltage generator circuit 1800 of this example further includes a plurality of NMOS transistors DT1 to DT7 and SWT1 to SWT5. NMOS transistors DT1 and SWT1 are connected in series between an output terminal 1811 for outputting the block word line voltage $V_{BLKWL}$ and the read voltage Vread. A gate of the NMOS transistor DT1 is connected to receive the read voltage Vread, and a gate of the NMOS transistor SWT1 is connected to receive an output signal of the high-voltage switch 1801, that is, the switch enable signal SW_EN1. NMOS transistors DT2 and SWT2 are connected in series between the output terminal 1811 and the pass voltage Vpass. A gate of the NMOS transistor DT2 is connected to receive the pass voltage Vpass, and a gate of the NMOS transistor SWT2 is connected to receive an output signal of the high-voltage switch 1802, that is, the switch enable signal SW_EN2. The diode-connected transistor DT1 constitutes a circuit for dropping the read voltage Vread and generating a dropped voltage (e.g., V1), and the diode-connected transistor DT2 constitutes a circuit for dropping the pass voltage Vpass and generating a dropped voltage (e.g., V2).

The NMOS transistors DT3, DT4, DT5, DT6, and DT7 are connected in series between the high voltage VPP and the NMOS transistor SWT3. Gates of the NMOS transistors DT3 to DT7 are connected to operate as a diode. The diode-connected transistors DT3 to DT7 constitute a circuit for dropping the high voltage VPP and generating a plurality of dropped voltages (e.g., V3, V4, and V5). The NMOS transistor SWT3 is connected between a source of the NMOS transistor DT7 and the output terminal 1811 and is controlled by a switch enable signal SW_EN3 from the high-voltage switch 1803. The NMOS transistor SWT4 is connected between a source of the NMOS transistor DT6 and the output terminal 1811, and is controlled by a switch enable signal SW_EN4 from the high-voltage switch 1804. The NMOS transistor SWT5 is connected between a source of the NMOS transistor DT4 and the output terminal 1811, and is controlled by a switch enable signal SW_EN5 from the high-voltage switch 1805.

The block word line voltage generator circuit 1800 of this example further includes a discharge part 1810 connected to the output terminal 1811. The discharge part 1810 discharges the output terminal 1811 to a power supply voltage in response to the control signal DIS. The discharge part 1810 includes PMOS transistors M0, M1, and M2, NMOS transistors M3, M4, and M5, and an inverter 10, which are connected as illustrated in FIG. 3.

In FIG. 3, the transistors DT1 to DT7, SWT1 to SWT5, M4 and M5 may be implemented by high voltage transistors capable of enduring the high voltage VPP.

Figure 4:
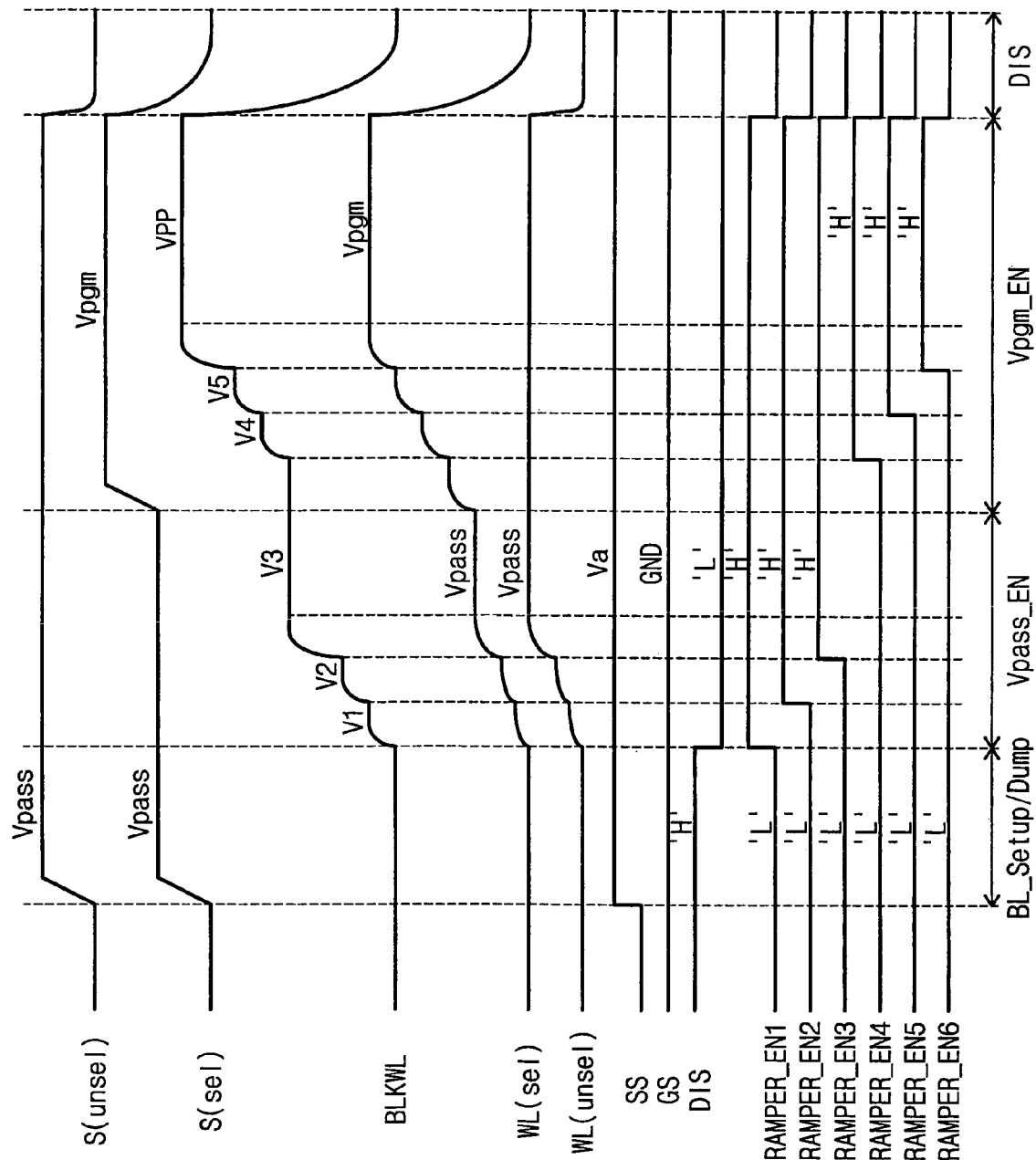
FIG. 4 is a timing diagram for describing a program operation of a flash memory device according to an embodiment of the present invention.

FIG. 4 is a timing diagram for describing a program operation of a flash memory device according to an embodiment of the present invention. Below, a program operation of a flash memory device according to the present invention will be more fully described with reference to accompanying drawings.

In the example of this embodiment, the program operation is executed by iteration of program loops after data to be programmed is loaded into the page buffer circuit 1200. While the data to be programmed is being loaded, control logic 1600 controls a high voltage generator circuit 1500 so as to prepare a high voltage VPP. At the same time, the control logic 1600 controls a word line voltage generator circuit 1400 so as to prepare a pass voltage Vpass, a program voltage Vpgm, a read voltage Vread, and a string selection line voltage Va. Once the data to be programmed is loaded onto the page buffer circuit 1200, bit lines are set to a power supply voltage or a ground voltage as a bit line bias voltage according to the loaded data, which is referred to here as a "bit line setup/dump period". During the bit line setup/dump period, as illustrated in FIG. 4, the second driver 1902 of the first decoding and driving block 1900 drives signal lines S0 to Sn-1 with the pass voltage Vpass from the pass voltage generator 1403. At this time, the first driver 1901 drives the signal line SS with the string selection line voltage Va, and the third driver 1903 drives the signal line GS with a ground voltage. Since a block word line BLKWL is maintained at a low level, NMOS transistors ST, GT, and WT0 to WTn-1 in the pass gate circuit 1700 are turned off. That is, the signal lines S0 to Sn-1 are not electrically connected to selection lines SSL and GSL and word lines WL0 to WLn-1. If bit lines are set to a desired voltage, a selected word line is driven with the program voltage Vpgm and unselected word lines are driven with the pass voltage Vpass, which will be more fully described below.

When the bit line setup/dump period terminates, the control logic 1600 deactivates the control signal DIS to a low level and activates the control signal RAMPER_EN1 to a high level. As the control signal RAMPER_EN1 is activated to high, the high-voltage switch 1801 of the block word line voltage generator circuit 1800 outputs the switch enable signal SW_EN1 having the high voltage VPP. This causes a voltage V1 (e.g., 3.4V) of (Vread-Vth) (Vth: a threshold voltage of DT1) to be output to an output terminal 1811 via an NMOS transistor SWT1. That is, the block word line voltage $V_{BLKWL}$ has the voltage V1 of (Vread-Vth). A second decoding and driving block 2000 drives the block word line BLKWL with the voltage V1 in response to a block address BA. After a given time (e.g., about 1 µs), as illustrated in FIG. 4, the control logic 1600 activates a control signal RAMPER_EN2 at a high level. As the control signal RAMPER_EN2 is activated to high, a high-voltage switch 1802 of the block word line voltage generator circuit 1800 outputs the switch enable signal SW_EN2 having the high voltage VPP. This cause a voltage V2 (e.g., 6.5V) of (Vpass-Vth) to be output to the output terminal 1811 via an NMOS transistor SWT2. Accordingly, the block word line BLKWL is driven with the block word line voltage $V_{BLKWL}$ being set at the voltage V2 of (Vpass-Vth). After a given time (e.g., about 1 µs), as illustrated in FIG. 4, the control logic 1600 activates the control signal RAMPER_EN3 to a high level. As the control signal RAMPER_EN3 is activated to high, the high-voltage switch 1803 of the block word line voltage generator circuit 1800 outputs the switch enable signal SW_EN3 having the high voltage VPP. This causes a voltage V3 (e.g., 13V) of (VPP-5Vth) (Vth: a threshold voltage of DT3 to DT7) be output to the output terminal 1811 via an NMOS transistor SWT3. Accordingly, the block word line BLKWL is driven with the block word line voltage $V_{BLKWL}$ being set at the voltage V3 of (VPP-5Vth).

As described above, as the control signals RAMPER_EN1 to RAMPER_EN3 are sequentially activated during the pass voltage enable period Vass_EN, the block word line voltage $V_{BLKWL}$ is stepwise increased to the voltage V3 (VPP-5Vth) such that the pass voltage Vpass on the signal lines S0 to Sn-1 are supplied to word lines W0 to WLn-1 through NMOS transistors WT0 to WTn-1 of the pass gate circuit 1700 without a voltage drop. Herein, the voltage V3 (e.g., about 13V) is higher than the pass voltage Vpass (e.g., about 10V). When the word lines WL0 to WLn-1 are driven with the pass voltage Vpass and the string selection line SSL is driven with the voltage Va (e.g., 1.3V), a channel of a NAND string connected to a bit line having a power supply voltage is charged up to a voltage of (Va-Vth) (Vth: a threshold voltage of SST). At this time, the string selection transistor SST is shut off. That is, the channel of the NAND string is floated. On the other hand, a channel of a NAND string connected to a bit line having a ground voltage is charged to a ground voltage.

Since a word line WLn-1 just adjacent to the string selection line SSL is driven with the stepwise increased pass voltage Vpass, a capacitive coupling between the string selection line SSL and the word line WLn-1 is reduced. Accordingly, it is possible to suppress an increase in a voltage of the string selection line SSL otherwise caused by capacitive coupling resulting when the pass voltage Vpass is supplied.

After the word lines WL0 to WLn-1 are driven with the pass voltage Vpass, the second driver 1902 of the first decoding and driving block 1900 drives a word line (e.g., WLn-1) corresponding to the page address PA with the program voltage Vpgm from the program voltage generator 1402. At this time, the block word line BLKWL is driven with the voltage V3 of (VPP-5Vth) from the block word line voltage generator circuit 1800. After a given time (e.g., about 1 µs), the control logic 1600 activates a control signal RAMPER_EN4 at a high level. As the control signal RAMPER_EN4 is activated, a high-voltage switch 1804 of the block word line voltage generator circuit 1800 outputs the switch enable signal SW_EN4 having the high voltage VPP. This enables the voltage V4 of (VPP-4Vth) (e.g., 15V) to be output to the output terminal 1811 via an NMOS transistor SWT4. That is, the block word line BLKWL is driven with the block word line voltage VBLKWL being set at the voltage V4 of (VPP-4Vth). The control logic 1600 sequentially activates control signals RAMPER_EN5 and RAMPER_EN6 in a manner similar to that described previously. Finally, as the control signal RAMPER_EN6 is activated, a high-voltage switch 1806 outputs the high voltage VPP to the output terminal 1811. That is, the block word line voltage $V_{BLKWL}$ becomes the high voltage VPP. As the block word line BLKWL is driven with the high voltage VPP as the block word line voltage $V_{BLKWL}$, a selected word line (e.g., WLn-1) is sufficiently driven with the program voltage Vpgm via the second driver 1902. With this bias condition, programming of memory cells of the selected word line WLn-1 initiates.

Since the selected word line WLn-1 adjacent to the string selection line SSL is driven with the stepwise increased program voltage Vpgm, the capacitive coupling between the string selection line SSL and the word line WLn-1 can be reduced. This means that it is possible to suppress an increase in a voltage of the string selection line SSL which would otherwise be caused by capacitive when the program voltage Vpgm is supplied. Further, as the selected word line WLn-1 is driven with the stepwise increased program voltage Vpgm, the voltage increase of one or two word lines adjacent to a selected word line is suppressed. As a result, soft programming of memory cells of unselected word lines can be avoided.

Once the program voltage enable period Vpgm_EN is terminated, the program and pass voltages Vpgm and Vpass applied to the word lines WL0 to WLn-1 are discharged. Afterward, a verify read operation is performed to read out data bits of memory cells of the selected word line WLn-1, and then a column scan operation is carried out to judge whether the read data bits are program pass data. If at least one of the read data bits is program fail data, a program loop may be repeated within a given range in the same manner as described above. The program loop includes the bit line setup/dump period, the pass voltage enable period, the program voltage enable period, the discharge period, the verify read period, and the column scan period.

As set forth above, it is possible to suppress a capacitive coupling phenomenon between word lines and between the string selection line SSL and a word line (e.g., WLn-1) by stepwise controlling a slope of a voltage applied to the block word line BLKWL. With this word line enable method, it is possible to suppress a program inhibit fail phenomenon and a soft program phenomenon by controlling the slope of the block word line voltage.

Figure 5:
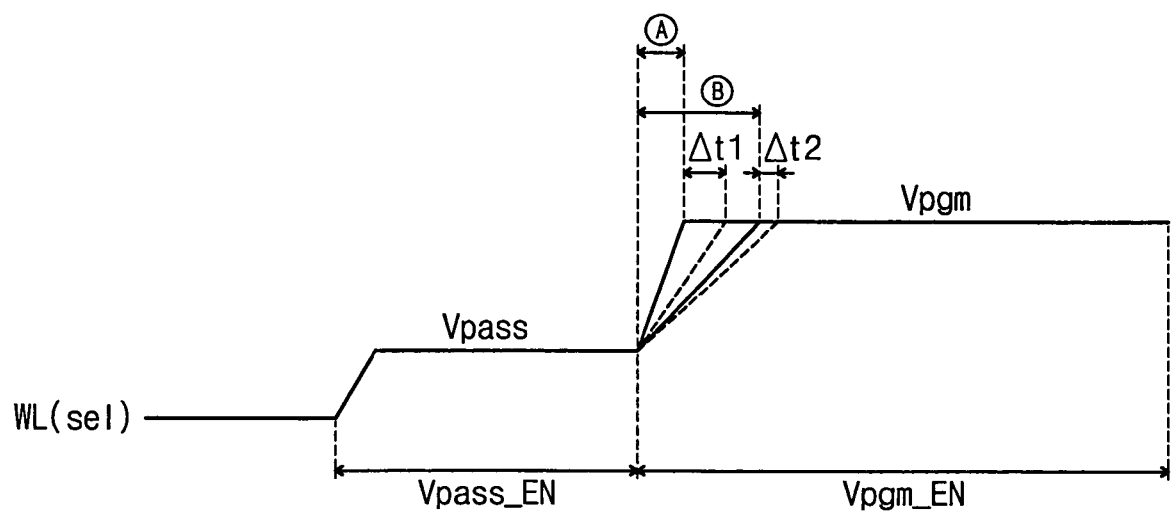
FIG. 5 is a diagram showing variations in a selected word line voltage according to a word line enable method of a flash memory device according to an embodiment of the present invention.

FIG. 5 is a diagram showing the voltage of a selected word line WL(sel) during the pass voltage enable period Vpass_EN and the program voltage enable period Vpgm_EN.

Referring to FIG. 5, the program voltage Vpgm is applied to a selected word line in the program voltage enable period Vpgm_EN. The rise time of the program voltage Vpgm (used to set a control gate voltage of a selected memory cell) differs according to a distance of the selected memory cell from the first decoding and driving block 1900. For example, referring to FIG. 2, the memory cells of bit line BLm-1 are spaced further from the first decoding and driving block 1900 than are the memory cells of bit line BL0. A relatively fast rise time "circle-A" of FIG. 5 is utilized for a memory cell (e.g., the memory cells of bit line BL0) placed relative close to the first decoding and driving block 1900, whereas a relatively longer rise time "circle-B" of FIG. 5 is utilized for a memory cell (e.g., the memory cells of bit line BLm-1) located farther the first decoding and driving block 1900. This is because control gate loading of a memory cell placed far from the first decoding and driving block 1900 is more than control gate loading of a memory cell placed close to the first decoding and driving block 1900.

In cells placed relatively far from the first decoding and driving block 1900, the time in which the program voltage is applied is relatively short when compared with cells placed closer to the first decoding and driving block 1900. This delta between program voltage application times means that a threshold voltage distribution can become wider than a desired threshold voltage distribution. To compensate, an overall programming time is increased to minimize the relative impact of the differing rise times of the program voltage on threshold distributions. However, increasing the programming time in this manner can increase stress applied to the memory cells located close to the first decoding and driving block 1900.

However, in accordance with the word line enable method of the present invention, it is possible to decrease the rise time (increase the slope) of the program voltage Vpgm. This is because the slope of the pass/program voltage is adjusted by controlling the block word line voltage VBLKWL, rather than by the conventional technique of controlling the program and pass voltages Vpgm and Vpass. As a result, referring to FIG. 5, the rise time can be decreased (the slope can be increased) by Δt1 for a memory cell located close to the first decoding and driving block 1900, whereas the rise time can be decreased (the slope can be increased) by Δt2 for a memory cell located far from the first decoding and driving block 1900. Here, Δt1 is greater than Δt2, and accordingly, the difference in rise times for the close and far memory cells is reduced. Thus, an increase in overall programming time may be increased to lesser extent, which in turn can reduce the stress applied to the memory cells located close to the first decoding and driving block 1900.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A word line enable method in a flash memory device comprising driving a signal line corresponding to a selected word line with a word line voltage, and stepwise increasing a gate voltage of a switch transistor connected between the selected word line and the signal line during a program execute period.

2. The word line enable method of claim 1, wherein the word line voltage comprises either one of a pass voltage and a program voltage.

3. The word line enable method of claim 1, wherein the switch transistor is a block select transistor.

4. The word line enable method of claim 1, wherein the program execute period comprises a pass voltage enable period and a program voltage enable period.

5. The word line enable method of claim 4, wherein the stepwise increasing of the gate voltage comprises:

stepwise increasing the gate voltage of the switch transistor up to a first voltage so that a pass voltage is transferred to the selected word line as the word line voltage, during the pass voltage enable period; and stepwise increasing the gate voltage of the switch transistor up to a second voltage which is higher than the first voltage so that a program voltage is transferred to the selected word line as the word line voltage, during the program voltage enable period.

6. The word line enable method of claim 5, wherein the first voltage is higher than the pass voltage and the second voltage is higher than the program voltage.

7. The word line enable method of claim 1, wherein the gate voltage is a block word line voltage.

8. A word line enable method in a flash memory device comprising:
   generating a high voltage which is higher than a word line voltage;
   driving a signal line corresponding to a selected word line with the word line voltage;
   generating a stepwise increased block word line voltage in response to the high voltage during a program execute period; and
   driving the selected word line with the word line voltage of the signal line in response to stepwise increased block word line voltage.

9. The word line enable method of claim 8, further comprising:
   driving signal lines corresponding to respective unselected word lines with the word line voltage.

10. The word line enable method of claim 9, wherein the word line voltage is a pass voltage.

11. The word line enable method of claim 8, wherein the program execute period comprises a pass voltage enable period and a program voltage enable period.

12. The word line enable method of claim 11, wherein during the pass voltage enable period, signal lines corresponding to the selected word line and unselected word lines are driven with the pass voltage as the word line voltage.

13. The word line enable method of claim 12, wherein during the pass voltage enable period, the block word line voltage is stepwise increased up to a voltage which is higher than the pass voltage so that the pass voltage is transferred to the selected and unselected word lines.

14. The word line enable method of claim 11, wherein during the program voltage enable period, a signal line corresponding to the selected word line is driven with a program voltage as the word line voltage.

15. The word line enable method of claim 14, wherein during program voltage enable period, the block word line voltage is stepwise increased up to a voltage which is higher than the program voltage so that the program voltage is transferred to the selected word line.

16. The word line enable method of claim 8, wherein a signal line corresponding to the selected word line is driven with the word line voltage during a bit line setup/dump period.

17. A flash memory device comprising:
   a memory block including memory cells connected to word lines and bit lines;
   a first decoding and driving block for driving signal lines corresponding to the respective word lines with word line voltages;
   a block word line voltage generator circuit for receiving a high voltage and generating a block word line voltage that increases stepwise during a program execute period;
   a second decoding and driving block for driving a block word line with the block word line voltage; and
   a pass gate circuit for connecting the signal lines to the respective word lines in response to the block word line voltage.

18. The flash memory device of claim 17, wherein the program execute period comprises a pass voltage enable period and a program voltage enable period.

19. The flash memory device of claim 18, wherein during the pass voltage enable period, the block word line voltage generator circuit generates the block word line voltage so as to increase stepwise up to a voltage which is higher than a pass voltage.

20. The flash memory device of claim 18, wherein during the program voltage enable period, the block word line voltage generator circuit generates the block word line voltage so as to increase stepwise up to a voltage which is higher than a program voltage.

21. The flash memory device of claim 18, wherein the first decoding and driving block drives the signal lines with a pass voltage during a bit line setup/dump period.

22. The flash memory device of claim 18, wherein the first decoding and driving block drives a signal line selected by a page address with a program voltage during the program voltage enable period.

23. The flash memory device of claim 17, wherein the word line voltages comprise a program voltage and a pass voltage.

24. The flash memory device of claim 17, wherein the block word line voltage generator circuit receives the high voltage, a pass voltage and a read voltage, and generates a stepwise increased block word line voltage.

* * * * *